US010042702B2

(12) United States Patent
Byeon

(10) Patent No.: US 10,042,702 B2
(45) Date of Patent: Aug. 7, 2018

(54) MEMORY DEVICE TRANSFERRING DATA BETWEEN MASTER AND SLAVE DEVICE AND SEMICONDUCTOR PACKAGE INCLUDING THE SAME

(71) Applicant: SK hynix Inc., Gyeonggi-do (KR)

(72) Inventor: Sang-Jin Byeon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/345,050

(22) Filed: Nov. 7, 2016

(65) Prior Publication Data
US 2018/0129560 A1    May 10, 2018

(51) Int. Cl.
| G06F 11/10 | (2006.01) |
| G11C 7/10 | (2006.01) |
| G11C 29/52 | (2006.01) |
| G11C 5/02 | (2006.01) |

(52) U.S. Cl.
CPC .......... G06F 11/1068 (2013.01); G11C 5/02 (2013.01); G11C 7/10 (2013.01); G11C 29/52 (2013.01)

(58) Field of Classification Search
CPC ....... G06F 11/1068; G11C 7/10; G11C 29/52; G11C 5/02
See application file for complete search history.

(56) References Cited

U.S. PATENT DOCUMENTS

| 2010/0121994 | A1* | 5/2010 | Kim | .................... | G06F 13/1684 |
| | | | | | 710/51 |
| 2012/0317352 | A1* | 12/2012 | Kang | ................ | G11C 11/40611 |
| | | | | | 711/106 |
| 2014/0376295 | A1 | 12/2014 | Oh et al. | | |
| 2016/0062830 | A1* | 3/2016 | Cha | ........................ | G11C 29/52 |
| | | | | | 714/764 |
| 2017/0308299 | A1* | 10/2017 | Cha | ........................ | G06F 3/061 |

FOREIGN PATENT DOCUMENTS

KR          101644917          8/2016

* cited by examiner

Primary Examiner — Richard Elms
Assistant Examiner — Jerome Leboeuf
(74) Attorney, Agent, or Firm — IP & T Group LLP

(57) ABSTRACT

A semiconductor package includes: memory devices that are stacked one on another; and an inter-layer channel for communication between the memory devices, wherein each memory device includes: a data pad; a memory core; a data input/output circuit that inputs/outputs data through the data pad; an inter-layer channel transfer circuit that transfers a read data transferred from the memory core to the inter-layer channel or transfers a data inputted through the data input/output circuit to the inter-layer channel; an inter-layer channel reception circuit receiving the data of the inter-layer channel; a read error correction circuit correcting an error of the data transferred from the inter-layer channel reception circuit to produce an error-corrected data and transfers the error-corrected data to the data input/output circuit; and a write error correction circuit generating a parity data to be stored in the memory core based on the data transferred from the inter-layer channel reception circuit.

15 Claims, 3 Drawing Sheets

MEMORY DEVICE TRANSFERRING DATA BETWEEN MASTER AND SLAVE DEVICE AND SEMICONDUCTOR PACKAGE INCLUDING THE SAME

BACKGROUND

1. Field

Exemplary embodiments of the present invention relate generally to a memory device and a semiconductor package including the memory device.

2. Description of the Related Art

Recently, memory devices are used in almost all electronic systems. The capacity and data rate of the memory devices are increasing day by day. Substantial research is underway to mount more memory devices with greater capacity within a shrinking area and to efficiently drive the memory devices.

Also, to increase the integration degree of a semiconductor chip, the memory chip disposition technology is changing into three-dimensional (3D) schemes where a plurality of memory chips may be stacked in a 3D structure. Generally, a 3D memory chip disposition scheme may improve the integration degree and the capacity of the semiconductor chip while reducing the chip size.

One example of a 3D memory chip disposition scheme is the Through Silicon Via (TSV) scheme. The TSV scheme provides a solution to such problems as deterioration in transfer rate according to the distance from a controller on a module or a change in a package and vulnerability of data bandwidth. According to the TSV scheme, a plurality of stacked memory chips communicate with one another through a path penetrating the stacked chips and electrodes formed in the path.

SUMMARY

Embodiments of the present invention are directed to an efficient error correction technology in a semiconductor package including a plurality of memory devices.

In accordance with an embodiment of the present invention, a semiconductor package includes: a plurality of memory devices that are stacked one on another; and an inter-layer channel for communication between the plurality of the memory devices, wherein each of the plurality of the memory devices includes: a data pad; a memory core; a data input/output circuit that inputs/outputs data through the data pad; an inter-layer channel transfer circuit that transfers a read data transferred from the memory core to the inter-layer channel or transfers a data inputted through the data input/output circuit to the inter-layer channel; an inter-layer channel reception circuit that receives the data of the inter-layer channel; a read error correction circuit that corrects an error of the data transferred from the inter-layer channel reception circuit so as to produce an error-corrected data and transfers the error-corrected data to the data input/output circuit; and a write error correction circuit that generates a parity data to be stored in the memory core based on the data transferred from the inter-layer channel reception circuit.

One memory device among the plurality of the memory devices may be a master memory device, and the other memory devices may be slave memory devices, and a data pad of the master memory device may be electrically connected to an external data line in an exterior of the semiconductor package, and data pads of the slave memory devices may be disabled.

A read error correction circuit of the master memory device may be enabled, and read error correction circuits of the slave memory devices may be disabled.

The read error correction circuit of the master memory device may perform an error correction operation, when the plurality of the memory devices in the semiconductor package perform a read operation.

The inter-layer channel transfer circuit of the master memory device may transfer a write data inputted through the data input/output circuit to the inter-layer channel during a write operation of the plurality of the memory devices in the semiconductor package.

The inter-layer channel transfer circuits of the master memory device and the slave memory devices may transfer a read data and a parity data that are read from the memory core of a corresponding memory device to the inter-layer channel during a read operation of the corresponding memory device.

The inter-layer channel reception circuit of the master memory device may receive a read data and a parity data from the inter-layer channel and transfer the read data and the parity data to the read error correction circuit during the read operation of the plurality of the memory devices in the semiconductor package.

The inter-layer channel reception circuits of the master memory device and the slave memory devices may receive the write data from the inter-layer channel and transfer the received write data to the write error correction circuit of a corresponding memory device during a write operation of the corresponding memory device.

The write error correction circuit may generate the parity data, when the memory device to which the write error correction circuit belongs performs a write operation.

After the semiconductor package is set to perform a data mask operation, the write error correction circuit may generate the parity data by using a portion of the data transferred from the inter-layer channel reception circuit and a portion of a data already stored in the memory core.

In accordance with another embodiment of the present invention, a semiconductor package includes: a master memory device that transfers/receives data to/from an external device in an exterior of the semiconductor package; one or more slave memory devices that transfer/receive data to/from the external device in the exterior of the semiconductor package through the master memory device; and a channel for communication between the master memory device and the one or more slave memory devices, wherein when the master memory device and the one or more slave memory devices perform a write operation, a parity data for error correction is generated and stored in a memory device that performs the write operation, and when the master memory device and the one or more slave memory devices perform a read operation, the master memory device performs an error correction operation by using a read data and a parity data that are read from a memory device that performs the read operation.

The master memory device and the one or more slave memory devices may be stacked in the semiconductor package, and a data pad of the master memory device may be electrically connected to an external data line in an exterior of the semiconductor package.

The master memory device and the one or more slave memory devices may be formed the same, and whether a memory device is to be a master memory device or a slave memory device may be decided by setting.

In accordance with yet another embodiment of the present invention, a semiconductor package includes: a master memory device that transfers/receives data to/from an external device in an exterior of the semiconductor package; one or more slave memory devices that transfer/receive data to/from the external device in the exterior of the semiconductor package through the master memory device; and an inter-layer channel for communication between the master memory device and the one or more slave memory devices, wherein when the master memory device includes: a data pad; a first memory core; a data input/output circuit that inputs/outputs data through the data pad; a parity generation circuit that generates a parity data based on an input data inputted through the data input/output circuit; a first inter-layer channel transfer circuit that transfers a read data and a parity data that are read from the first memory core to the inter-layer channel during a read operation of the master memory device, and transfers the data inputted through the data input/output circuit and the parity data to the inter-layer channel during a write operation of the master memory device and the one or more slave memory devices; a first inter-layer channel reception circuit that receives the data and the parity data of the inter-layer channel during the write operation of the master memory device and during the read operation of the master memory device and the one or more slave memory devices; a first write error correction circuit that corrects an error of the data transferred from the first inter-layer channel reception circuit based on the parity data transferred from the first inter-layer channel reception circuit during the write operation of the master memory device; and a read error correction circuit that corrects the error of the data transferred from the first inter-layer channel reception circuit based on the parity data transferred from the first inter-layer channel reception circuit so as to produce error-corrected data and transfers the error-corrected data to the data input/output circuit during the read operation of the master memory device and the one or more slave memory devices, wherein each of the one or more slave memory devices includes: a second memory core; a second inter-layer channel transfer circuit that transfers the data and the parity data that are read from the second memory core to the inter-layer channel during the read operation of the corresponding slave memory device; a second inter-layer channel reception circuit that receives the data and the parity data of the inter-layer channel during the write operation of the corresponding slave memory device; and a second write error correction circuit that corrects an error of the data transferred from the first inter-layer channel reception circuit based on the parity data transferred from the first inter-layer channel reception circuit during the write operation of the corresponding slave memory device.

The one or more slave memory devices may be stacked over the master memory device.

The inter-layer channel may include a plurality of Through Silicon Vias (TSVs).

In accordance with still another embodiment of the present invention, a memory device includes: a data pad; a memory core; a data input/output circuit that inputs/outputs data through the data pad; an inter-layer channel transfer circuit that transfers a read data from the memory core to an inter-layer channel or transfers a data inputted through the data input/output circuit to the inter-layer channel; an inter-layer channel reception circuit that receives the data of the inter-layer channel; a read error correction circuit that corrects an error of the data transferred from the inter-layer channel reception circuit so as to produce an error-corrected data and transfers the error-corrected data to the data input/output circuit; and a write error correction circuit that generates a parity data to be stored in the memory core based on the data transferred from the inter-layer channel reception circuit, wherein the data pad, the data input/output circuit, and the read error correction circuit are enabled when the memory device is set as a master memory device, and disabled when memory device is set as a slave memory device.

When the memory device is set to perform a data mask operation, the write error correction circuit may generate the parity data by using a portion of the data transferred from the inter-layer channel reception circuit and a portion of a data already stored in the memory core.

The inter-layer channel may be a channel for communication between the memory device and one or more other memory devices that are stacked along with the memory device.

In accordance with still another embodiment of the present invention, a semiconductor package, comprising: a master memory device and a slave memory device communicatively coupled via a common inter-layer channel; wherein the master device includes: a first data pad; a first memory core for storing data; a first data input/output circuit suitable for transferring data to/from the master memory device through the first data pad; a first inter-layer channel transfer circuit suitable for transferring a first read data from the first memory core to the common inter-layer channel and for transferring a write data from the first data input/output circuit to the common inter-layer channel; a first inter-layer channel reception circuit suitable for receiving the first read data and the write data from the common inter-layer channel; a first read error correction circuit suitable for correcting an error of the first read data transferred from the first inter-layer channel reception circuit for producing an error-corrected first read data, and for transferring the error-corrected first read data to the first data input/output circuit; and wherein the slave device includes: a second memory core for storing data; a second inter-layer channel transfer circuit suitable for transferring a second read data from the second memory core to the common inter-layer channel; a second inter-layer channel reception circuit suitable for receiving the write data of the common inter-layer channel.

The master device may further include a first write error correction circuit suitable for generating a first write parity data to be stored in the first memory core based on the write data transferred from the first inter-layer channel reception circuit, and wherein the slave device further includes a second write error correction circuit suitable for generating a second write parity data to be stored in the memory core based on the write data transferred from the second inter-layer channel reception circuit.

The first read error correction circuit may be further suitable for correcting an error of the second read data transferred via the second inter-layer channel transfer circuit, the common inter-layer channel and the first inter-layer channel reception circuit to produce an error-corrected second read data, and for transferring the error-corrected second read data to the first data input/output circuit.

The first data pad may be electrically connected to an external data line.

The slave device may further include a second data pad which is disabled.

The slave device may include a second read error correction circuit, and wherein the first read error correction circuit is enabled, and the second read error correction circuit is disabled.

The first inter-layer channel transfer circuit may transfer the write data inputted through the first data input/output circuit to the common inter-layer channel during a write operation of the master memory device.

The first inter-layer channel transfer circuit may transfer the write data inputted through the first data input/output circuit to the common inter-layer channel during a write operation of the slave memory device.

The first inter-layer channel transfer circuit may transfer a first read parity data corresponding to the first read data from the first memory core to the common inter-layer channel during a read operation of the master memory device, and wherein the second inter-layer channel transfer circuit may transfer a second read parity data corresponding to the second read data from the second memory core to the common inter-layer channel during a read operation of the slave memory device.

The first inter-layer channel reception circuit may receive the first read data and the first read parity data from the common inter-layer channel and transfers the first read data and the first read parity data to the first read error correction circuit during a read operation of the master memory device.

The first inter-layer channel reception circuit may receive the second read data and the second read parity data from the common inter-layer channel, and transfer the second read data and the second read parity data to the first read error correction circuit during a read operation of the slave memory device.

The first and second inter-layer channel reception circuits may receive the write data from the common inter-layer channel, and transfer the received write data to the respective first and second write error correction circuits during a write operation of the master and slave memory devices respectively.

The first write error correction circuit may generate the first write parity data during a write operation of the master device, and wherein the second write error correction circuit generates the second write parity data during a write operation of the slave device.

During a data mask operation of the semiconductor package, the first and second write error correction circuits may generate the respective first and second write parity data based on unmasked write data transferred from the common inter-layer channel reception circuit and a masked data among data already stored in the first or second memory cores, respectively.

In accordance with still another embodiment of the present invention, a semiconductor package, comprising: a master memory device suitable for outputting read data to an external device, and receiving write data from the external device; a slave memory device suitable for outputting read data to the master memory device, and receiving write data from the master memory device; and a channel for communication between the master memory device and the slave memory device, wherein during respective write operations of the master and slave memory devices, the master and slave memory devices performing the respective write operations generate a parity data for the write data, and wherein during respective read operations of the master and slave memory devices, the master memory device error-corrects a read data from the master and slave memory devices performing the respective read operations.

The master memory device and the slave memory device may be stacked in the semiconductor package, and wherein a data pad of the master memory device may be electrically connected to the external device.

The master memory device may include: a data pad; a first memory core; a data input/output circuit suitable for transferring data to/from the master memory device through the data pad; a parity generation circuit suitable for generating a parity data based on the write data from the data input/output circuit; a first inter-layer channel transfer circuit suitable for transferring the read data from the first memory core to the inter-layer channel during a read operation of the master memory device, and suitable for transferring the write data from the data input/output circuit and the parity data from the parity generation circuit to the inter-layer channel during respective write operations of the master memory device and the slave memory device; a first inter-layer channel reception circuit suitable for receiving the write data and the parity data from the inter-layer channel during the write operation of the master memory device, and suitable for receiving the read data during respective read operations of the master memory device and the slave memory device; a first write error correction circuit suitable for error-correcting the write data transferred from the first inter-layer channel reception circuit based on the parity data transferred from the first inter-layer channel reception circuit during the write operation of the master memory device; and a read error correction circuit suitable for error-correcting the read data transferred from the first inter-layer channel reception circuit so as to produce error-corrected data and transfers the error-corrected data to the data input/output circuit during the respective read operations of the master memory device and the slave memory device, wherein the slave memory device includes: a second memory core; a second inter-layer channel transfer circuit suitable for transferring the read data from the second memory core to the inter-layer channel during the read operation of the slave memory device; a second inter-layer channel reception circuit suitable for receiving the write data and the parity data of the inter-layer channel during the write operation of the slave memory device; and a second write error correction circuit suitable for error-correcting the write data transferred from the first inter-layer channel reception circuit based on the parity data transferred from the first inter-layer channel reception circuit during the write operation of the slave memory device.

The slave memory device may be stacked over the master memory device, and wherein the inter-layer channel may include a plurality of Through Silicon Vias (TSVs).

In accordance with still another embodiment of the present invention, a memory device, comprising: a data pad; a memory core; a data input/output circuit suitable for transferring data to/from the memory device through the data pad; an inter-layer channel transfer circuit suitable for transferring a read data from the memory core to an inter-layer channel or transferring a data from the data input/output circuit to the inter-layer channel; an inter-layer channel reception circuit suitable for receiving the data of the inter-layer channel; a read error correction circuit suitable for error-correcting the data from the inter-layer channel reception circuit so as to produce an error-corrected data, and transferring the error-corrected data to the data input/output circuit; and a write error correction circuit suitable for generating a parity data to be stored in the memory core based on the data from the inter-layer channel reception circuit, wherein the data pad, the data input/output circuit, and the read error correction circuit are enabled when the memory device is set as a master memory device, and disabled when memory device is set as a slave memory device.

When the memory device is set to perform a data mask operation, the write error correction circuit may generate the parity data by using a portion of the data transferred from the inter-layer channel reception circuit and a portion of a data already stored in the memory core.

The inter-layer channel may be a channel for communication between the memory device and one or more other memory devices that are stacked along with the memory device.

In accordance with still another embodiment of the present invention, a semiconductor package comprising: at least first and second memory devices; and an inter-layer channel suitable for communicatively coupling the first and second memory devices, wherein each of the first and second memory devices includes: a memory core; an inter-layer channel unit suitable for transferring a read data from the memory core to the inter-layer channel during a read operation of corresponding memory device; and a write error correction circuit suitable for generating a parity data to be stored in the memory core based on a write data from the inter-layer channel during a write operation of corresponding memory device.

The first memory device may further include: a data input/output unit suitable for receiving the write data from an external and outputting the read data to the external; and a read error correction circuit suitable for error-correcting the read data, and transferring the error-corrected data to the data input/output unit, and wherein the inter-layer channel unit of the first memory device further provides the read error correction circuit with the read data from the inter-layer channel during respective read operations of the first and second memory devices.

The inter-layer channel unit of the first memory device may further transfer the write data from the data input/output unit to the write error correction circuit of the first and second memory devices through the inter-layer channel during the write operations of the first and second memory devices, respectively.

The data input/output unit may include a parity generation circuit suitable for generating a parity data for the write data from the external, wherein the inter-layer channel unit of the first memory device may further transfer the write data and the parity data from the data input/output unit to the write error correction circuit of the first and second memory devices through the inter-layer channel during the write operations of the first and second memory devices, respectively, and wherein the write error correction circuit may further error-correct the write data according to the parity data generated by the parity generation circuit without generating the parity bit.

BRIEF DESCRIPTION OF THE DRAWINGS

The above and other features and advantages of the present invention will become more apparent to those skilled in the art to which the present invention belongs by describing in detail various embodiments thereof with reference to the attached drawings in which.

DETAILED DESCRIPTION

Figures 1, 2:
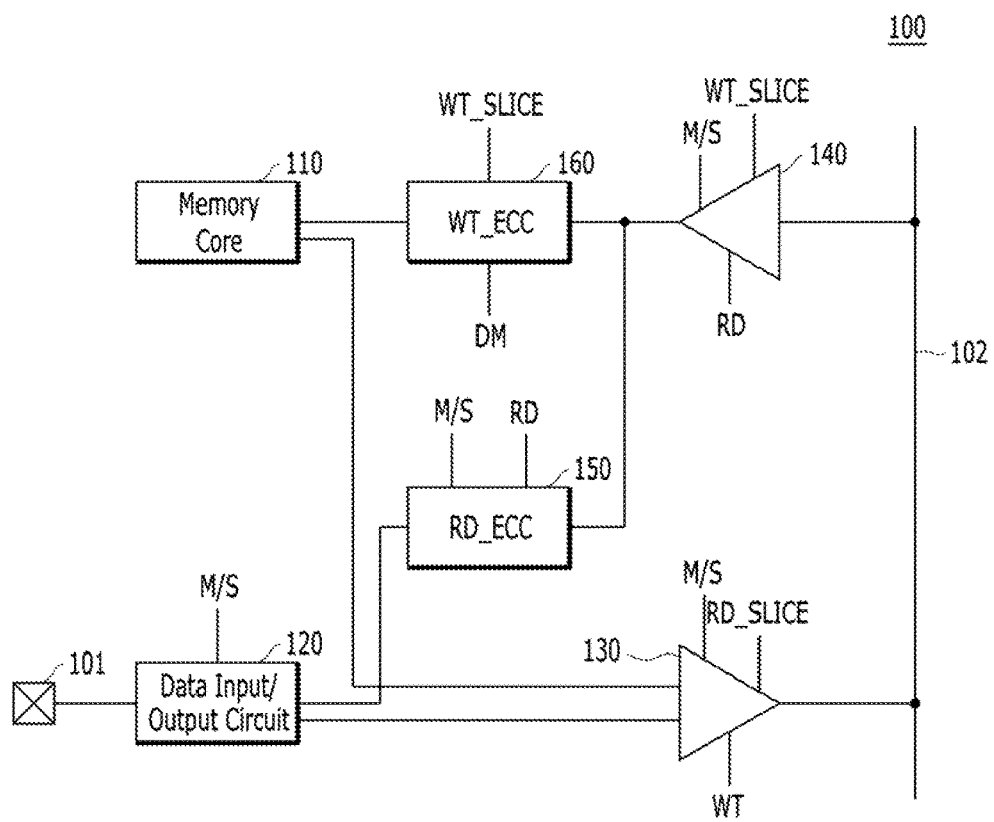
FIG. 1 is a block diagram illustrating a memory device including an error correction circuit, in accordance with an embodiment of the present invention.
FIG. 2 is a block diagram illustrating a configuration example of the write error correction circuit of FIG. 1.

Exemplary embodiments of the present invention will be described below in more detail with reference to the accompanying drawings. The present invention may, however, be embodied in different forms and should not be construed as being limited to the embodiments set forth herein. Rather, these embodiments are provided so that this disclosure will be thorough and complete, and will fully convey the present invention to those skilled in the art. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to more clearly illustrate the various elements of the embodiments. For example, in the drawings, the size of elements and the intervals between elements may be exaggerated compared to actual sizes and intervals for convenience of illustration.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

Spatially relative terms, such as "under," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in manufacturing, use or operation in addition to the orientation depicted in the figures. For example, if the device in the figures is turned over, elements described as "below" or "under" other elements or features would then be "above" the other elements or features. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

Referring now to FIG. 1, a memory device 100 is provided, in accordance with an embodiment of the present invention. The memory device 100 is configured so that it may be stacked together with other similar memory devices and or different memory devices from the memory device 100, in a semiconductor package which will be described in detail with reference to FIGS. 3 and 4.

Referring to FIG. 1, the memory device 100 may include a data pad 101, a memory core 110, a data input/output circuit 120, an inter-layer channel transfer circuit 130, an inter-layer channel reception circuit 140, a read error correction circuit 150, and a write error correction circuit 160. The memory device 100 may be stacked in a semiconductor package along with other memory devices. We also note, that although FIG. 1 exemplifies the memory device as including only one of each of the aforementioned elements, it should be understood that in other embodiments a memory device 100 may include a two or more of each of the aforementioned elements without departing from the scope of the present invention.

The data pad 101 may be enabled when the memory device 100 is set as a master device and disabled when the memory device 100 is set as a slave device. An external data line (not shown) in the exterior of the memory device 100 may be coupled to data pad 101 when the data pad 101 is enabled. The external data line in the exterior of the memory device 100 may be electrically isolated from the data pad 101 when the data pad 101 is disabled.

The memory core 110 may include a plurality of elements for storing data and for reading data from the device. The memory core 110 may include, for example, such known elements as a cell array provided with a plurality of memory cells for storing data, a row decoder which enables a word line, a column decoder which selects a column, a bit-line sense amplifier which senses data, a write driver which transfers a write data to the bit-line sense amplifier during a write operation, and an input/output sense amplifier which transfers the sensed data of the bit-line sense amplifier to the outside of the memory core 110 during a read operation.

The data input/output circuit 120 may transfer data between the memory device 100 and an external device such as a host through the data pad 101. The data input/output circuit 120 may be enabled when the memory device 100 is set as a master device, and disabled when the memory device 100 is set as a slave device. The data input/output circuit 120 may be enabled/disabled in response to a master/slave signal M/S. For example, the master/slave signal M/S may be enabled to '1' when the memory device 100 is set as a master device, and disabled to '0' when the memory device 100 is set as a slave device. The data input/output circuit 120 may operate in a read operation mode based on an inputted read signal RD. The data input/output circuit 120 may also operate in a write operation mode based on an inputted a write signal WT. The read and or write signals RD and WT may be inputted directly from the external device when the memory device 100 is a master device. When the memory device is a slave device the read and or write signals RD and WT may be inputted indirectly from the external device through a master device.

The inter-layer channel transfer circuit 130 may transfer read data and parity data from the memory core 110 to an inter-layer channel 102. Also, the inter-layer channel transfer circuit 130 may transfer an input data from the data input/output circuit 120 to the inter-layer channel 102. The operation of the inter-layer channel transfer circuit 130 may be different according to whether the memory device 100 is set as a master device or a slave device.

When the memory device 100 is set as a master device, the inter-layer channel transfer circuit 130 may transfer the read data and the parity data which are read from the memory core 110 to the inter-layer channel 102 during a read operation of the memory device 100. Also, when the memory device 100 is set as a master device and one among the memory devices stacked in the semiconductor package performs a write operation, including the memory device 100 itself, the inter-layer channel transfer circuit 130 of the memory device 100 may transfer the input data from the data input/output circuit 120 to the inter-layer channel 102.

When the memory device 100 is set as a slave device, the inter-layer channel transfer circuit 130 may transfer the read data and the parity data which are read from the memory core 110 to the inter-layer channel 102 during a read operation of the memory device 100.

Based on the master/slave signal M/S, the inter-layer channel transfer circuit 130 may detect whether the memory device 100 is set as a master device or a slave device. Based on the slice read signal RD_Slice the inter-layer transfer circuit 130 may detect whether the memory device 100 performs the read operation. Based on the write signal WT the memory device may detect whether another one among the memory devices stacked in the semiconductor package performs the write operation. The slice read signal RD_SLICE may be enabled when the memory device 100 performs the read operation. The write signal WT may be enabled when another one among the memory devices stacked in the semiconductor package performs the write operation.

The inter-layer channel reception circuit 140 may receive the data (read data, parity data or input data) via the inter-layer channel 102 and may transfer the received data to the read error correction circuit 150 or the write error correction circuit 160. The operation of the inter-layer channel reception circuit 140 may be different according to whether the memory device 100 is set as a master device or a slave device.

When the memory device 100 is set as a master device, the inter-layer channel reception circuit 140 may transfer the data received from the inter-layer channel 102 to the write error correction circuit 160 during a write operation of the memory device 100. When the memory device 100 is set as a master device and another one among the memory devices stacked in the semiconductor package performs a read operation, the inter-layer channel reception circuit 140 of the memory device 100 may transfer the read data and the parity data received from the inter-layer channel 102 to the read error correction circuit 150.

When the memory device 100 is set as a slave device, the inter-layer channel reception circuit 140 may transfer the data received from the inter-layer channel 102 to the write error correction circuit 160 during a write operation of the memory device 100.

Based on the master/slave signal M/S, the slice write signal WT_SLICE, and the read signal RD, the inter-layer channel reception circuit 140 may respectively detect whether the memory device 100 is set as a master device or a slave device, whether the memory device 100 performs a write operation, whether another one among the memory devices stacked in the semiconductor package performs a read operation. The slice write signal WT_SLICE may be enabled when the memory device 100 performs a write operation. The read signal RD may be enabled when another one among the memory devices stacked in the semiconductor package performs a read operation.

During the write operation of the memory device 100 or when the slice write signal WT_SLICE is enabled, the write error correction circuit 160 may generate the parity data of the data transferred from the inter-layer channel reception circuit 140, and transfer the data and the parity data to the memory core 110 to store the data and the parity data.

When the memory device 100 is set to perform a data mask operation according to an enabled data mask signal DM during the write operation, unmasked data among the data transferred from the inter-layer channel reception circuit 140 may be stored in the memory core 110. In this case, the write error correction circuit 160 may generate the parity data based on the unmasked data among the data transferred from the inter-layer channel reception circuit 140 and the masked data among the data that are already stored in the memory core 110.

The read error correction circuit 150 may be enabled when the memory device 100 is set as a master device and disabled when the memory device 100 is set as a slave device. In case where the memory device 100 is set as a master device and when another one among the memory devices stacked in the semiconductor package performs a read operation, the read error correction circuit 150 may receive the data and the parity data from the inter-layer channel reception circuit 140, correct an error of the data based on the parity data so as to produce an error-corrected data, and transfer the error-corrected data to the data input/output circuit 120. Based on the master/slave signal M/S and the read signal RD, the read error correction circuit 150 may respectively detect whether the memory device 100 is set as a master device or a slave device, and whether another one among the memory devices stacked in the semiconductor package performs a write operation.

FIG. 2 is a block diagram illustrating a more detailed configuration of the write error correction circuit 160 shown in FIG. 1.

Referring to FIG. 2, the write error correction circuit 160 may include a parity generator 210, an error corrector 220, and a data combiner 230. A data mask signal DM may be enabled when a data mask operation is set and may be disabled when a data mask operation is not set.

During a write operation which does not a mask operation (also referred to hereinafter as a normal write operation) the data mask signal DM is disabled and the slice write signal WT_SLICE is enabled. The parity generator 210 may generate a parity data based on the data transferred from the inter-layer channel reception circuit 140 and transfer the data and the parity data to the memory core 110.

During a write operation supporting a data mask operation the data mask signal DM is enabled, the slice write signal WT_SLICE is also enabled, and the error corrector 220 reads masked data, corresponding parity data which is already generated and with which is stored in the memory core 110. The error corrector 220 may error-correct the masked data based on the corresponding parity data. During the write operation supporting a data mask operation, the masked data already stored in the memory core 110 may be combined with unmasked data provided from the inter-layer channel reception circuit 140, and the combined data may be written into the memory core 110.

During the write operation supporting a data mask operation, the data combiner 230 may combine the unmasked data among the data transferred from the inter-layer channel reception circuit 140 and the masked data, which is read from the memory core 110 and error-corrected by the error corrector 220, thereby producing the combined data.

The error corrector 220 and the data combiner 230 are disabled during a normal write operation.

During a write operation supporting a data mask operation, the parity generator 210 may generate new parity data based on the combined data and transfer the combined data and the parity data for the combined data to the memory core 110.

Figure 3:
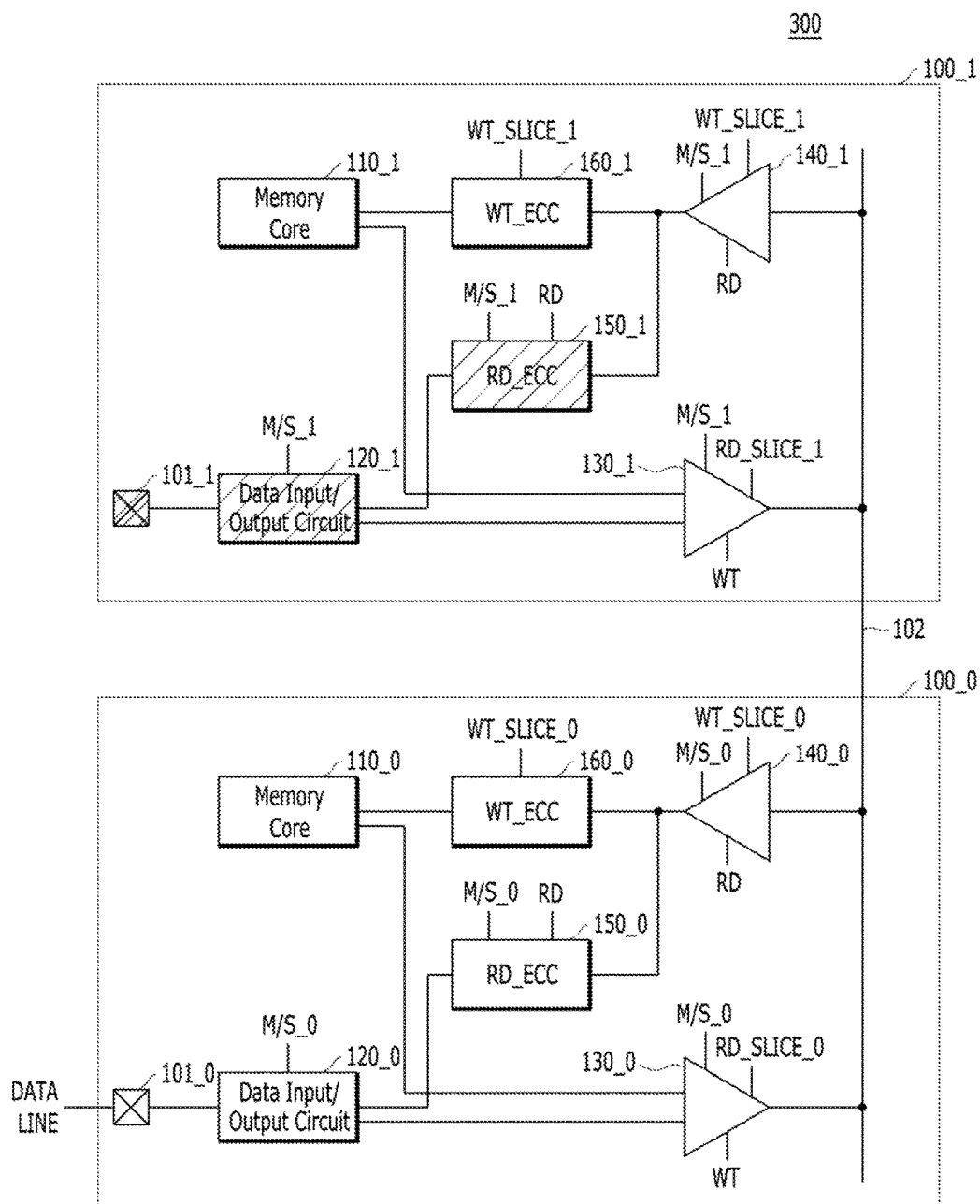
FIG. 3 is a block diagram illustrating a semiconductor package 300, in accordance with an embodiment of the present invention.

FIG. 3 illustrates a semiconductor package 300, in accordance with an embodiment of the present invention.

Referring to FIG. 3, the semiconductor package 300 includes two stacked memory devices 100_0 and 100_1, which are communicatively coupled to each other through the inter-layer channel 102. The respective memory devices 100_0 and 100_1 may each correspond to the memory device 100 described with reference to FIGS. 1 and 2. The inter-layer channel 102 may include a plurality of Through Silicon Vias (TSVs). Although the embodiment of FIG. 3 illustrates only two memory devices stacked in the semiconductor package 300, the present invention is not limited in this way. For example, three or more memory devices may be stacked to form a semiconductor package using the same configuration and operating method as described for the semiconductor package 300.

Referring now again to the embodiment of FIG. 3, one of the memory devices, for example memory device 100_0 may be set as a master device, and the other memory device, for example, 100_1 may be set as a slave device. For example, for selecting memory device 100_0 as the master device and the memory device 100_0 as the slave device, a master/slave signal M/S_0 of the memory device 100_0 may be enabled to '1', and a master/slave signal M/S_1 of the memory device 100_1 may be enabled to '0'. Although FIG. 3 shows that the semiconductor package 300 includes two memory devices 100_0 and 100_1 and thus there is one slave device, the number of the slave memory devices may be two or more. In variations of the embodiment of FIG. 3, three, four or more slave devices may be communicatively coupled to a single master device via a common interlayer channel 102. For example, in an embodiment employing four memory devices stacked in the semiconductor package, one memory device may be a master device and the other three memory devices may be slave devices.

Since the memory device 100_0 is set as a master memory device, a data pad 101_0 of the memory device 100_0 may be coupled to an external data line DATA LINE of the semiconductor package 300. Since the memory device 100_1 is set as a slave memory device, the data pad 101_1, the data input/output circuit 120_1 and the read error correction circuit 150_1 may be disabled. FIG. 3 illustrates the disabled elements 101_1, 120_1 and 150_1 in the slave memory device 100_1 hatched with oblique parallel lines.

Hereafter, the operations of the semiconductor package 300 (1) when a write operation is performed in the master memory device 100_0, (2) when a read operation is performed in the master memory device 100_0, (3) when a write operation is performed in the slave memory device 100_1, and (4) when a read operation is performed in the slave memory device 100_1 are described.

(1) Operation of the Semiconductor Package 300 when a Write Operation is Performed in the Master Memory Device 100_0

When a write operation is performed in the master memory device 100_0, the write signal WT may be enabled to '1'; the slice write signal WT_SLICE_0 of the master memory device 100_0 may be enabled to '1'; and the slice write signal WT_SLICE_1 of the slave memory device 100_1 may be disabled to '0'.

During the write operation of the master memory device 100_0, the data input/output circuit 120_0 of the master memory device 100_0 may receive a write data through the data pad 101_0. The write data may be transferred to the inter-layer channel 102 through the inter-layer channel transfer circuit 130. The write data of the inter-layer channel 102 may be transferred to the write error correction circuit 160_0 through the inter-layer channel reception circuit 140_0. The write error correction circuit 160_0 may generate a parity data based on the write data. The write data and the parity data corresponding to the write data may be written in the memory core 110_0. When the data mask operation is set up, the write error correction circuit 160_0 may combine the unmasked data among the write data with the masked data stored in the memory core 110_0 and generate a parity data for the combined data.

(2) Operation of the Semiconductor Package 300 when a Read Operation is Performed in the Master Memory Device 100_0

When a read operation is performed in the master memory device 100_0, the read signal RD may be enabled to '1'; the slice read signal RD_SLICE_0 of the master memory device 100_0 may be enabled to '1'; and the slice write signal RD_SLICE_1 of the slave memory device 100_1 may be disabled to '0'.

During the read operation of the master memory device 100_0, a read data and a parity data corresponding to the read data may be read from the memory core 110_0 and transferred to the inter-layer channel transfer circuit 130_0. The inter-layer channel transfer circuit 130_0 may transfer the read data and the parity data to the read error correction circuit 150_0 through the inter-layer channel 102 and the inter-layer channel reception circuit 140_0. The read error correction circuit 150_0 may correct an error of the read data based on the parity data so as to produce an error-corrected read data. The error-corrected read data may be transferred to the data input/output circuit 120_0. The data input/output circuit 120_0 then may output the read data through the data pad 101_0.

(3) Operation of the Semiconductor Package 300 when a Write Operation is Performed in the Slave Memory Device 100_1

When a write operation is performed in the slave memory device 100_1, the write signal WT may be enabled to '1'; the slice write signal WT_SLICE_1 of the slave memory device 100_1 may be enabled to '1'; and the slice write signal WT_SLICE_0 of the master memory device 100_0 may be disabled to '0'.

During the write operation of the slave memory device 100_1, the data input/output circuit 120_0 of the master memory device 100_0 may receive a write data through the data pad 101_0. The write data may be transferred to the inter-layer channel 102 through the inter-layer channel transfer circuit 130. The write data of the inter-layer channel 102 may be transferred to the write error correction circuit 160_1 through the inter-layer channel reception circuit 140_1 in the slave memory device 100_1. The write error correction circuit 160_1 may generate a parity data based on the write data. The write data and the parity data corresponding to the write data may be written in the memory core 110_1. When a data mask operation is set up, the write error correction circuit 160_1 may combine the unmasked data among the write data with the masked data stored in the memory core 110_1 and generate new parity data for the combined data.

(4) Operation of the Semiconductor Package 300 when a Read Operation is Performed in the Slave Memory Device 100_1

When a read operation is performed in the slave memory device 100_1, the read signal RD may be enabled to '1'; the slice read signal RD_SLICE_1 of the slave memory device 100_1 may be enabled to '1'; and the slice read signal RD_SLICE_0 of the master memory device 100_0 may be disabled to '0'.

During the read operation of the slave memory device 100_1, a read data and a parity data corresponding to the read data may be read from the memory core 110_1 and transferred to the inter-layer channel transfer circuit 130_1. The inter-layer channel transfer circuit 130_1 may transfer the read data and the parity data to the read error correction circuit 150_0 of the master memory device 100_0 through the inter-layer channel 102 and the inter-layer channel reception circuit 140_0 of the master memory device 100_0. The read error correction circuit 150_0 may correct an error of the read data based on the parity data so as to produce an error-corrected read data. The error-corrected read data may be transferred to the data input/output circuit 120_0. The data input/output circuit 120_0 then may output the read data through the data pad 101_0.

As described above, during a write operation of the semiconductor package 300, the write error correction circuit 160_0 or 160_1 of the memory device 100_0 or 100_1 that performs the write operation may generate the parity data for the write data. Also, as described above, during a read operation of the semiconductor package 300, the read error correction circuit 150_0 of the master memory device 100_0 may error-correct the read data while the read error correction circuit 150_1 of the slave memory device 100_1 is disabled. In other words, the read error correcting operation for correcting the read data may be performed right before the read data is outputted to the outside of the semiconductor package 300. Therefore, according to an embodiment of the present invention it is possible to correct even the data errors occurring while a data is transferred between the memory devices 100_0 and 100_1 through the inter-layer channel 102.

FIG. 3 shows the master memory device 100_0 and the slave memory device 100_1, which are the same as each other while some elements (marked with oblique lines) in the slave memory device 100_1 are disabled. In that sense, in an embodiment, the slave memory device 100_1 may be designed not to include the disabled elements of FIG. 3.

In an embodiment, the master memory device 100_0 and the slave memory device 100_1 may be different memory devices. For example, the master memory device 100_0 may be a DRAM device and the slave memory device 100_1 may be a flash memory device.

Figure 4:
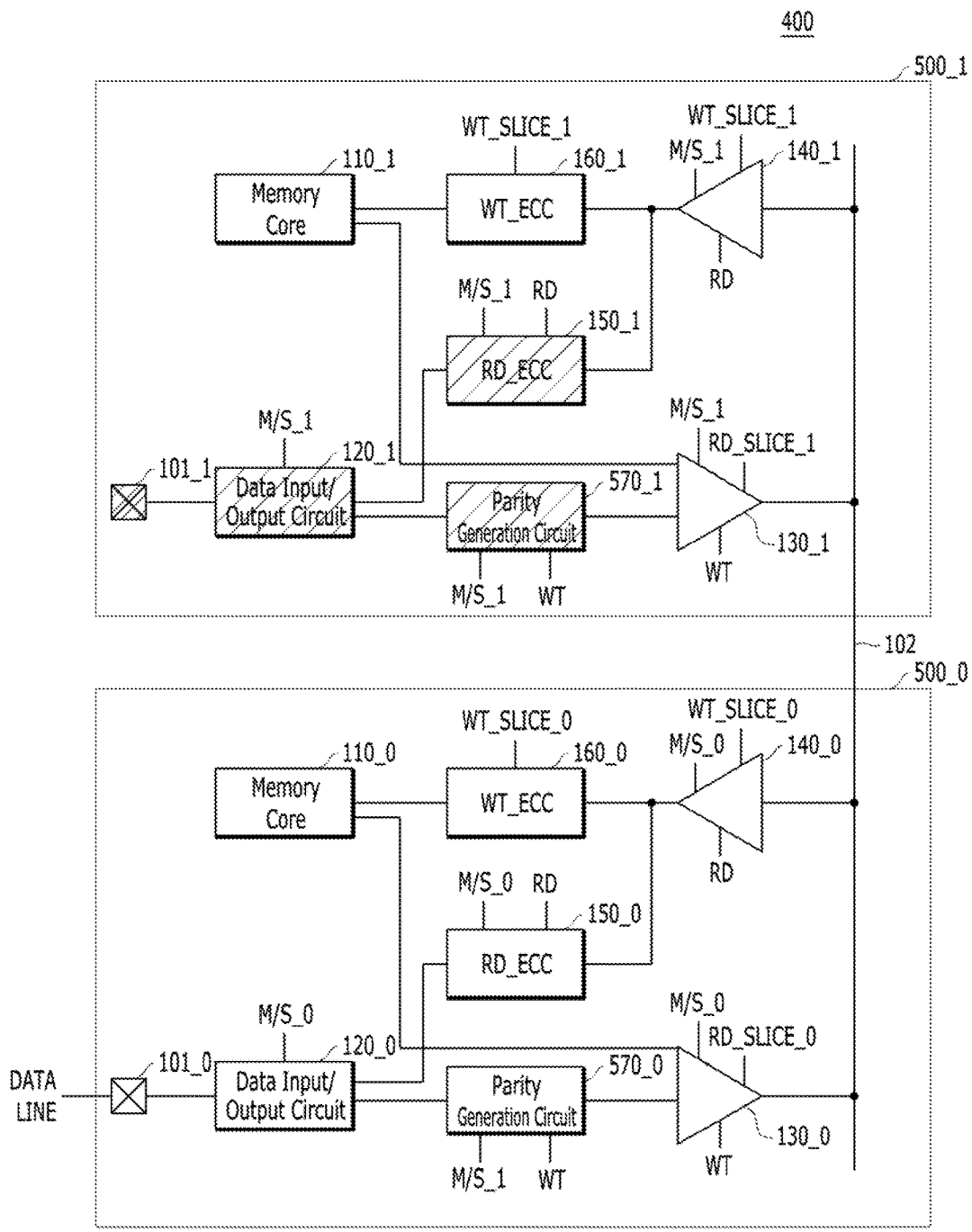
FIG. 4 is a block diagram illustrating a semiconductor package 400, in accordance with another embodiment of the present invention.

FIG. 4 illustrates a semiconductor package 400 in accordance with another embodiment of the present invention.

Referring to FIG. 4, the semiconductor package 400 includes two stacked memory devices 500_0 and 500_1, which are communicatively coupled to each other through the inter-layer channel 102. Although the embodiment of FIG. 4 illustrates only two memory devices stacked in the semiconductor package 400, the present invention is not limited in this way. For example, 3, 4 or more memory devices may be stacked to form a semiconductor package using the same configuration and operating method as described for the semiconductor package 400.

The respective memory devices 500_0 and 500_1 are the same as the memory device 100 described with reference to FIGS. 1 and 2 except that each of the memory devices 500_0 and 500_1 further includes a parity generation circuit 570_0 and 570_1, respectively. The inter-layer channel 102 may include a plurality of Through Silicon Vias (TSVs).

One among the memory devices 500_0 and 500_1 may be set as a master device, and the other memory device may be set as a slave device. In the embodiment of FIG. 4, it is illustrated that memory device 500_0 is the master device while memory device 500_1 is the slave device. For setting the memory device 500_0 as the master device the master/slave signal M/S_0 of the memory device 500_0 may be enabled to '1'. For setting memory device 500_1 as the slave device the master/slave signal M/S_1 of the memory device 500_1 may be enabled to '0'. FIG. 4 illustrates the disabled elements 101_1, 120_1, 150_1 and 570_1 in the slave memory device 500_1 are marked with oblique lines.

Although FIG. 4 shows that the semiconductor package 400 includes two memory devices 500_0 and 500_1 and thus there is one slave device, the number of the slave memory devices may be two or more. Hence, in variations of the embodiment of FIG. 4, three, four or more slave devices may be communicatively coupled to a single master device via a common interlayer channel 102. For example, in an embodiment employing four memory devices stacked in the semiconductor package, one memory device may be a master device and the other three memory devices may be slave devices.

The parity generation circuits 570_0 and 570_1 may be enabled when the corresponding memory device is set as a master device. For example, when the master slave signal M/S_0 is enabled to '1', the parity generation circuit 570_0 is enabled. Also, for example, when the master slave signal M/S_1 is enabled to '1', the parity generation circuit 570_1 may be enabled. When the semiconductor package 400 performs a write operation for example when the write signal WT for the master device 500_0 is enabled, the parity generation circuits 570_0 may generate the parity data based on the write data before the write data is transferred to the inter-layer channel 102 through the inter-layer channel transfer circuit 130_0. The parity generation circuits 570_0 and 570_1 may be the same as the parity generator 210 of the write error correction circuit 160 shown in FIG. 2.

Hereafter, the operations of the semiconductor package 400 (1) when a write operation is performed in the master memory device 500_0, (2) when a read operation is performed in the master memory device 500_0, (3) when a write operation is performed in the slave memory device 500_1, and (4) when a read operation is performed in the slave memory device 500_1 are described.

(1) Operation of the Semiconductor Package 400 when a Write Operation is Performed in the Master Memory Device 500_0

When a write operation is performed in the master memory device 500_0, the write signal WT may be enabled to '1'; the slice write signal WT_SLICE_0 of the master memory device 500_0 may be enabled to '1'; and the slice write signal WT_SLICE_1 of the slave memory device 500_1 may be disabled to '0'.

During the write operation of the master memory device 500_0, the data input/output circuit 120_0 of the master memory device 500_0 may receive a write data through the data pad 101_0. The write data may be transferred to the parity generation circuit 570_0. The parity generation circuit 570_0 may generate a parity data based on the write data, and transfer the write data and the parity data to the inter-layer channel transfer circuit 130_0. The inter-layer channel transfer circuit 130_0 may transfer the write data and the parity data to the inter-layer channel 102. The write data and the parity data of the inter-layer channel 102 may be received by the inter-layer channel reception circuit 140_0 and transferred to the write error correction circuit 160_0. The write error correction circuit 160_0 may correct an error of the write data based on the parity data generated by the parity generation circuit 570_0. Since the write error correction circuit 160_0 includes the error corrector 220, the error of the write data may be corrected by the error corrector 220. Since the parity data corresponding to the write data is already generated by the parity generation circuit 570_0, the write error correction circuit 160_0 does not have to generate a parity data again. The error-corrected write data and the parity data corresponding to the error-corrected write data may be written in a memory core 110_0. When a data mask operation is set up, the data combiner 230 of the write error correction circuit 160_0 may combine the unmasked data among the write data with the masked data stored in the memory core 110_0, and the parity generator 210 may generate new parity data for the combined data.

(2) Operation of the Semiconductor Package 400 when a Read Operation is Performed in the Master Memory Device 500_0

When a read operation is performed in the master memory device 500_0, the read signal RD may be enabled to '1'; the slice read signal RD_SLICE_0 of the master memory device 500_0 may be enabled to '1'; and the slice write signal RD_SLICE_1 of the slave memory device 500_1 may be disabled to '0'.

During the read operation of the master memory device 500_0, a read data and a parity data corresponding to the read data may be read from the memory core 110_0 and transferred to the inter-layer channel transfer circuit 130_0. The inter-layer channel transfer circuit 130_0 may transfer the read data and the parity data to the read error correction circuit 150_0 through the inter-layer channel 102 and the inter-layer channel reception circuit 140_0. The read error correction circuit 150_0 may correct an error of the read data based on the parity data so as to produce an error-corrected read data. The error-corrected read data may be transferred to the data input/output circuit 120_0. The data input/output circuit 120_0 then may output the read data through the data pad 101_0.

(3) Operation of the Semiconductor Package 400 when a Write Operation is Performed in the Slave Memory Device 500_1

When a write operation is performed in the slave memory device 500_1, the write signal WT may be enabled to '1'; the slice write signal WT_SLICE_1 of the slave memory device 500_1 may be enabled to '1'; and the slice write signal WT_SLICE_0 of the master memory device 500_0 may be disabled to '0'.

During the write operation of the slave memory device 500_1, the data input/output circuit 120_0 of the master memory device 500_0 may receive a write data through the data pad 101_0. The write data may be transferred to the parity generation circuit 570_0. The parity generation circuit 570_0 may generate a parity data based on the write data, and transfer the write data and the parity data to the inter-layer channel transfer circuit 130_0. The inter-layer channel transfer circuit 130_0 may transfer the write data and the parity data to the inter-layer channel 102. The write data and the parity data of the inter-layer channel 102 may be received by the inter-layer channel reception circuit 140_1 and transferred to the write error correction circuit 160_1. The write error correction circuit 160_1 may correct an error of the write data based on the parity data generated by the parity generation circuit 570_0. Since the write error correction circuit 160_1 includes the error corrector 220, the error of the write data may be corrected by the error corrector 220. Since the parity data corresponding to the write data is already generated by the parity generation circuit 570_0 of the master device 500_0, the write error correction circuit 160_1 does not have to generate a parity data again. The write data and the parity data corresponding to the write data may be written in a memory core 110_1. When a data mask operation is set up, the data combiner 230 of the write error correction circuit 160_1 may combine the unmasked data among the write data with the masked data stored in the memory core 110_1, and the parity generator 210 may generate new parity data for the combined data.

(4) Operation of the Semiconductor Package 400 when a Read Operation is Performed in the Slave Memory Device 500_1

When a read operation is performed in the slave memory device 500_1, the read signal RD may be enabled to '1'; the slice read signal RD_SLICE_1 of the slave memory device 500_1 may be enabled to '1'; and the slice write signal RD_SLICE_0 of the master memory device 500_0 may be disabled to '0'.

During the read operation of the slave memory device 500_1, a read data and a parity data corresponding to the read data may be read from the memory core 110_1 and transferred to the inter-layer channel transfer circuit 130_1. The inter-layer channel transfer circuit 130_1 may transfer the read data and the parity data to a read error correction circuit 150_0 of the master memory device 500_0 through the inter-layer channel 102 and the inter-layer channel reception circuit 140_0 of the master memory device 500_0. The read error correction circuit 150_0 may correct an error of the read data based on the parity data so as to produce an error-corrected read data. The error-corrected read data may be transferred to the data input/output circuit 120_0. The data input/output circuit 120_0 then may output the read data through the data pad 101_0.

In the semiconductor package 400, a parity data is generated by the parity generation circuit 570_0 before a write data is transferred to the inter-layer channel 102, and an error of the write data transferred through the inter-layer channel 102 is corrected by the write error correction circuit 160_0 or 160_1 of the selected memory device, hence, an error of the write data occurring while the write data is transferred to the inter-layer channel 102 may be corrected as well. Also as described above, during the read operation of the semiconductor package 400, the read error correction circuit 150_0 of the master memory device 500_0 may error-correct the read data while the read error correction circuit 150_1 of the slave memory device 500_1 is disabled. In other words, the read error correcting operation for correcting the read data may be performed right before the read data is outputted to the outside of the semiconductor package 400. Therefore, it is possible to correct even the data errors occurring while a data is transferred between the memory devices 500_0 and 500_1 through the inter-layer channel 102.

FIG. 4 shows the master memory device 500_0 and the slave memory device 500_1, which are the same as each other while the elements 101_1, 120_1, 570_1 and RD_ECC (hatched with oblique parallel lines) in the slave memory device 100_1 are disabled. In that sense, in an embodiment, the slave memory device 500_1 does not include the disabled elements of FIG. 4.

The master memory device 500_0 and the slave memory device 500_1 may be memory devices of different kinds. To take an example, the master memory device 500_0 may be a DRAM device, and the slave memory device 500_1 may be a flash memory device.

According to the embodiments of the present invention, errors may be efficiently corrected in a semiconductor package including a plurality of memory devices.

While the present invention has been described with respect to specific embodiments, it will be apparent to those skilled in the art that various other changes and modifications may be made without departing from the spirit and scope of the invention as defined in the following claims.

What is claimed is:

1. A semiconductor package, comprising:
   a master memory device and a slave memory device communicatively coupled via a common inter-layer channel;
   wherein the master device includes:
      a first data pad;
      a first memory core for storing data;
      a first data input/output circuit configured to transfer data to/from the master memory device through the first data pad;
      a first inter-layer channel transfer circuit configured to transfer a first read data from the first memory core to the common inter-layer channel and transfer a write data from the first data input/output circuit to the common inter-layer channel;
      a first inter-layer channel reception circuit configured to receive the first read data and the write data from the common inter-layer channel; and
      a first read error correction circuit configured to correct an error of the first read data transferred from the first inter-layer channel reception circuit for producing an error-corrected first read data, and transfer the error-corrected first read data to the first data input/output circuit, and
   wherein the slave device includes:
      a second memory core for storing data;

a second inter-layer channel transfer circuit configured to transfer a second read data from the second memory core to the common inter-layer channel;

a second inter-layer channel reception circuit configured to receive the write data of the common inter-layer channel; and a second read error correction circuit, and wherein the first read error correction circuit is enabled, and the second read error correction circuit is disabled.

2. The semiconductor package of claim 1, wherein the master device further includes a first write error correction circuit configured to generate a first write parity data to be stored in the first memory core based on the write data transferred from the first inter-layer channel reception circuit, and wherein the slave device further includes a second write error correction circuit configured to generate a second write parity data to be stored in the memory core based on the write data transferred from the second inter-layer channel reception circuit.

3. The semiconductor package of claim 1, wherein the first read error correction circuit is further configured to correct an error of the second read data transferred via the second inter-layer channel transfer circuit, the common inter-layer channel and the first inter-layer channel reception circuit to produce an error-corrected second read data, and transfer the error-corrected second read data to the first data input/output circuit.

4. The semiconductor package of claim 1, wherein the first data pad is electrically connected to an external data line.

5. The semiconductor package of claim 1, wherein the slave device further includes a second data pad which is disabled.

6. The semiconductor package of claim 1, wherein the first inter-layer channel transfer circuit transfers the write data inputted through the first data input/output circuit to the common inter-layer channel during a write operation of the master memory device.

7. The semiconductor package of claim 1, wherein the first inter-layer channel transfer circuit transfers the write data inputted through the first data input/output circuit to the common inter-layer channel during a write operation of the slave memory device.

8. The semiconductor package of claim 1, wherein the first inter-layer channel transfer circuit transfers a first read parity data corresponding to the first read data from the first memory core to the common inter-layer channel during a read operation of the master memory device, and wherein the second inter-layer channel transfer circuit transfers a second read parity data corresponding to the second read data from the second memory core to the common inter-layer channel during a read operation of the slave memory device.

9. The semiconductor package of claim 8, wherein the first inter-layer channel reception circuit receives the first read data and the first read parity data from the common inter-layer channel and transfers the first read data and the first read parity data to the first read error correction circuit during a read operation of the master memory device.

10. The semiconductor package of claim 8, wherein the first inter-layer channel reception circuit receives the second read data and the second read parity data from the common inter-layer channel, and transfers the second read data and the second read parity data to the first read error correction circuit during a read operation of the slave memory device.

11. The semiconductor package of claim 2, wherein the first and second inter-layer channel reception circuits receive the write data from the common inter-layer channel, and transfer the received write data to the respective first and second write error correction circuits during a write operation of the master and slave memory devices respectively.

12. The semiconductor package of claim 2, wherein the first write error correction circuit generates the first write parity data during a write operation of the master device, and wherein the second write error correction circuit generates the second write parity data during a write operation of the slave device.

13. The semiconductor package of claim 12, wherein during a data mask operation of the semiconductor package, the first and second write error correction circuits generate the respective first and second write parity data based on unmasked write data transferred from the common inter-layer channel reception circuit and a masked data among data already stored in the first or second memory cores, respectively.

14. A memory device, comprising:

a data pad;

a memory core;

a data input/output circuit configured to transfer data to/from the memory device through the data pad;

an inter-layer channel transfer circuit configured to transfer a read data from the memory core to an inter-layer channel or transfer a data from the data input/output circuit to the inter-layer channel;

an inter-layer channel reception circuit configured to receive the data of the inter-layer channel;

a read error correction circuit configured to error-correct the data from the inter-layer channel reception circuit so as to produce an error-corrected data, and transfer the error-corrected data to the data input/output circuit; and a write error correction circuit configured to generate a parity data to be stored in the memory core based on the data from the inter-layer channel reception circuit, wherein the data pad, the data input/output circuit, and the read error correction circuit are enabled when the memory device is set as a master memory device, and disabled when memory device is set as a slave memory device.

15. The memory device of claim 14, wherein when the memory device is set to perform a data mask operation, the write error correction circuit generates the parity data by using a portion of the data transferred from the inter-layer channel reception circuit and a portion of a data already stored in the memory core.

* * * * *